(12) United States Patent
Kokura et al.

(10) Patent No.: US 7,476,936 B2
(45) Date of Patent: Jan. 13, 2009

(54) SUBSTRATE, LIQUID CRYSTAL DISPLAY HAVING THE SUBSTRATE, AND METHOD FOR PRODUCING SUBSTRATE

(75) Inventors: Masafumi Kokura, Kashiba (JP); Yoshiharu Kataoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 421 days.

(21) Appl. No.: 10/511,427

(22) PCT Filed: Apr. 14, 2003

(86) PCT No.: PCT/JP03/04727

§ 371 (c)(1),
(2), (4) Date: May 25, 2005

(87) PCT Pub. No.: WO03/088193

PCT Pub. Date: Oct. 23, 2003

(65) Prior Publication Data

US 2005/0255622 A1    Nov. 17, 2005

(30) Foreign Application Priority Data

Apr. 16, 2002  (JP) ............................. 2002-113903

(51) Int. Cl.
*H01L 27/12* (2006.01)

(52) U.S. Cl. .................. 257/347; 257/40; 257/411; 438/34; 438/148; 438/158; 438/155

(58) Field of Classification Search .............. 257/40, 257/411, 347
See application file for complete search history.

(56) References Cited

U.S. PATENT DOCUMENTS

| 6,034,748 A | 3/2000 | Furuta |
| 6,469,759 B2 | 10/2002 | Jang et al. |

(Continued)

FOREIGN PATENT DOCUMENTS

JP    8-18058 A    1/1996

(Continued)

OTHER PUBLICATIONS

International Search Report and English translation thereof mailed Jun. 3, 2003 in corresponding PCT application No. PCT/JP03/04727.

(Continued)

*Primary Examiner*—Zandra Smith
*Assistant Examiner*—Tsz K Chiu
(74) *Attorney, Agent, or Firm*—Nixon & Vanderhye P.C.

(57) ABSTRACT

The substrate (10) of the present invention includes: a first electrode (26) and a second electrode (30). The second electrode (30) is formed on an insulation film (52) covering at least a part of the first electrode (26) and electrically connected with the first electrode (26) through a contact hole (50) formed in the insulation film (52). The first electrode (26) includes a laminated structure of a metal film (42) and a protective film (44). An etching rate of the metal film (42) is almost equal to an etching rate of the protective film (44) with respect to a first etching for forming the metal film (42) and the protective film (44). An etching rate of the protective film (44) is almost zero with respect to a second etching for forming the contact hole (50).

11 Claims, 8 Drawing Sheets

U.S. PATENT DOCUMENTS

2004/0090564 A1* 5/2004 Lee .............................. 349/43

FOREIGN PATENT DOCUMENTS

JP         2000-275663 A    10/2000
JP         2000-284326 A    10/2000

OTHER PUBLICATIONS

International Preliminary Examination Report mailed Feb. 5, 2004 in corresponding PCT Application No. PCT/JP03/04727.

Korean Office Action mailed Apr. 26, 2006 in corresponding Korean application No. 10-2004-7016603.

* cited by examiner

SUBSTRATE, LIQUID CRYSTAL DISPLAY HAVING THE SUBSTRATE, AND METHOD FOR PRODUCING SUBSTRATE

This application is the U.S. national phase of international application of PCT/JP03/04727 filed 14 Apr. 2003 which claims priority of JP 2002-113903 filed Apr. 16, 2002, the entire contents of which are hereby incorporated by reference.

TECHNICAL FIELD

The present invention relates to a substrate, a liquid crystal display device with the same, and a manufacturing method thereof.

BACKGROUND ART

In a conventional active matrix substrate of a liquid crystal display device, it is known that a drain electrode of a thin film transistor and a pixel electrode are electrically connected through a contact hole. This pixel electrode is formed on an insulation film covering the drain electrode, and the contact hole is formed on the insulation film.

Figure 12:
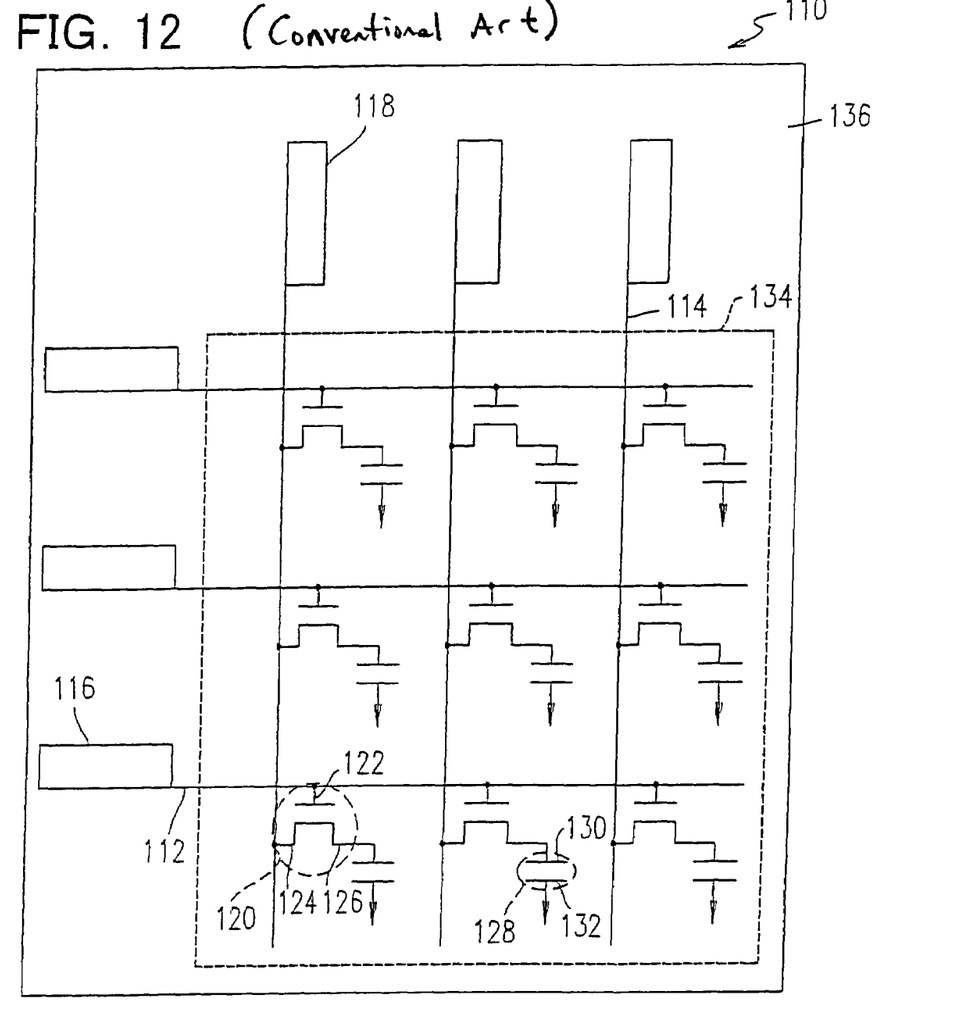
FIG. 12 is a schematic plan view of a conventional active matrix substrate.

FIG. 12 is a schematic plan view of a conventional active matrix substrate.

An active matrix substrate 110 comprises a plurality of thin film transistors (hereinafter, these are also referred to as "TFT") 120, a plurality of source signal lines 114, and a plurality of gate signal lines 112. The thin film transistors 120 are arranged in matrix states. The source signal lines 114 are provided in parallel having prescribed distances between each other along the thin film transistors 120 arranged along the column direction. The gate signal lines 112 are provided in parallel having prescribed distances between each other along the thin film transistors 120 arranged along the row direction.

To the plurality of source signal lines 114, corresponding source drivers 118 are connected respectively. Each source driver 118 applies a voltage to the corresponding source signal line 114, and this voltage corresponds to video signals.

To the plurality of gate signal lines 112, corresponding gate drivers 116 are connected respectively. Each gate driver 116 applies a voltage to the corresponding gate signal line 112, and this voltage corresponds to scanning signals.

Each of the plurality of thin film transistors 120 includes a gate electrode 122, a source electrode 124, and a drain electrode 126. The gate electrode 122 is branched from the corresponding gate signal line 112, and the source electrode 124 is branched from the corresponding source signal line 114.

Each of the plurality of drain electrodes 126 is connected with a corresponding pixel electrode 130. Each pixel electrode 130 is one terminal of a corresponding pixel capacitor 128. The other terminal of each pixel capacitor 128 is a counter electrode 132 provided on a counter substrate 154 (See FIGS. 14 and 15). The counter electrode 132 is generally shared with the plurality of pixel electrodes 130.

The active matrix substrate 110 includes a display region 134 and a terminal region 136. The display region 134 contributes the display of a video, and the terminal region 136 is arranged so as to surround a periphery of the display region 134. In the display region 134, a plurality of pixel electrodes 130 and thin film transistors 120 are arranged. In the terminal region 136, a plurality of gate drivers 116 and source drivers 118 are arranged.

Figure 14:
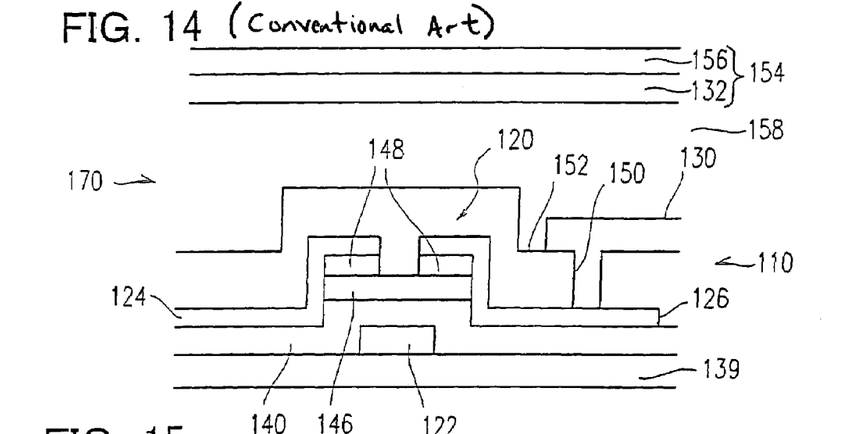
FIG. 14 is a cross-sectional view of a conventional liquid crystal display device taken along line P-P in FIG. 13.

A conventional liquid crystal display device 170 (See FIGS. 14 and 15) comprises the active matrix substrate 110, a counter substrate 154 (See FIGS. 14 and 15), and a liquid crystal 158 (See FIG. 14). The counter substrate 154 is opposed to the active matrix substrate 110. The liquid crystal 158 is inserted between the active matrix substrate 110 and the counter substrate 154.

When each of the plurality of thin film transistors 120 is turned on or off with respect to signals applied from the gate driver 116, the voltage corresponding to video signals applied from the source driver 118 is applied to the corresponding pixel electrode 130. The orientation of the liquid crystals is controlled according to the voltages applied to the pixel electrode 130 and the counter electrode 132. Thereby, video is displayed on the liquid crystal display device.

Figure 13:
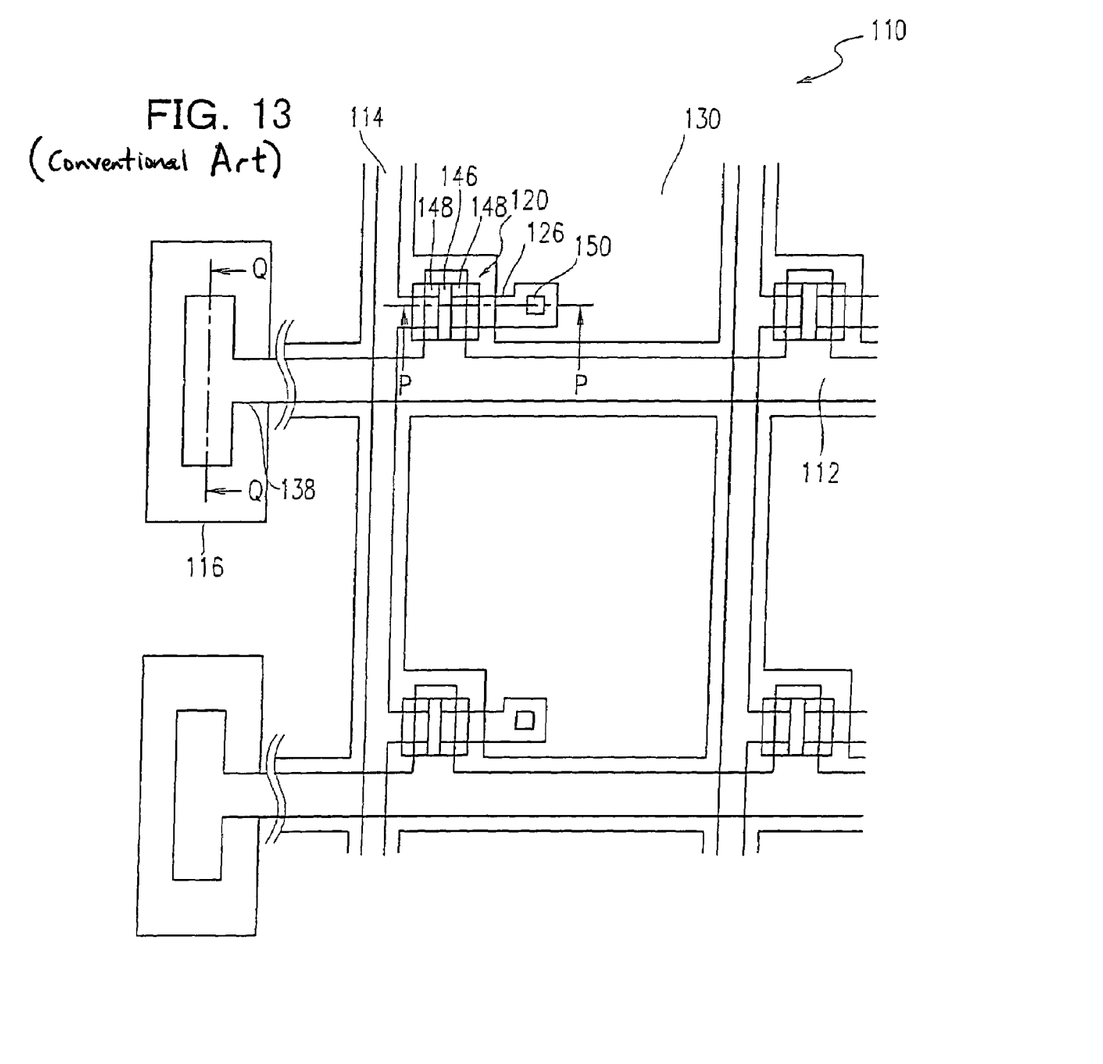
FIG. 13 is a cross-sectional view of a conventional active matrix substrate 110.

FIG. 13 is a plan view of the conventional active matrix substrate 110.

The gate driver 116 shown in FIG. 13 includes a signal input terminal section 138 in which scanning signals are inputted from outside.

The pixel electrode 130 is connected to the drain electrode 126 through a contact hole 150.

FIG. 14 is a cross-sectional view of a conventional liquid crystal display device taken along line P-P in FIG. 13.

The conventional liquid crystal display device 170 shown in FIG. 14 includes the active matrix substrate 110, the counter substrate 154, and the liquid crystal 158. The liquid crystal 158 is inserted between the active matrix substrate 110 and the counter substrate 154.

FIG. 14 shows a cross-sectional structure of the pixel electrode 130. The pixel electrode 130 is connected to the thin film transistor 120 and the drain electrode 126 of the thin film transistor 120, in the display region 134 of the active matrix substrate 110.

The active matrix substrate 110 includes a transparent insulation substrate 139. The gate electrode 122 is formed on the transparent insulation substrate 139. A gate insulation film 140 is formed on the transparent insulation substrate 139 so as to cover the gate electrode 122.

A semiconductor layer 146 is formed on the gate electrode 122 through the gate insulation film 140. An n+ silicon (Si) layer 148 is formed on the semiconductor layer 146 so as to align with the semiconductor layer 146.

The source electrode 124 branched from the source signal line 114 is formed on a part of the gate insulation film 140 so as to cover a part of a surface of the n+ Si layer 148, and sides of the n+ Si layer 148 and the semiconductor layer 146.

The drain electrode 126 is formed on the other part of the gate insulation film 140 so as to cover the other part of the surface of the n+ Si layer 148, the other sides of the n+ Si layer 148 and the semiconductor layer 146.

The source electrode 124 and the drain electrode 126 are arranged on the surface of the n+ Si layer 148 while having the prescribed distance between each other.

The thin film transistor 120 includes the gate electrode 122, the semiconductor layer 146, the n+ Si layer 148, the source electrode 124 and the drain electrode 126.

For increasing size or improving definition of the liquid crystal display device, it is desirable to reduce the resistances of the gate signal line 112, the source signal line 114, the gate electrode 122, the source electrode 124 and the drain electrode 126. Therefore, metals having low resistance and which are easily processed are generally used as materials of these signal lines and electrodes.

The general materials used for the gate signal line 112, the source signal line 114, the gate electrode 122, the source electrode 124 and the drain electrode 126 are Al, Mo, Ti, Ta, or the like.

Mo has comparatively low specific resistance, and is easily patterned by an etching using weak acid. Therefore, Mo is preferably used as a material for the source signal line 114, the source electrode 124 and the drain electrode 126.

Although Al has the lowest specific resistance in the above-mentioned materials, Al does not preferably contact with the n+ Si layer 148, and thus a single layer of Al is not preferably used as a material for the source electrode 124 and the drain electrode 126. Therefore, when Al is used for the source signal line, a laminated structure, for example, Al/Ti, Al/Mo, or the like, is necessary.

Since Ti has a higher specific resistance than that of Al and Mo, a single layer of Ti is not preferably used as a material for the electrode and the signal line of the liquid crystal display device which is increased in size.

Since Ta has also a high specific resistance like Ti, a single layer of Ta is not preferably used.

An insulation film 152 for protecting the thin film transistor 120 is formed on the gate insulation film 140 so as to cover the other parts of surfaces of the source electrode 124, the drain electrode 126 and the n+ Si layer 148. The material of the insulation film 152 is, for example, $SiN_x$.

The insulation film 152 includes the contact hole 150 penetrating the insulation film 152 and extending to the drain electrode 126.

The pixel electrode 130 is formed on the insulation film 152 so as to connect with the drain electrode 126 through the contact hole 150. The material of the pixel electrode 130 is transparent ITO.

In the liquid crystal display device, more particularly, the transparent TFT liquid crystal display device, the above-mentioned constitution is preferably used, that is, the constitution comprising forming the thin film transistor 120, forming the insulation film 152 so as to cover the drain electrode 126 of the thin film transistor 120, and forming the pixel electrode 130 so as to electrically connect with the drain electrode 126 through the contact hole 150 formed in the insulation film 152.

The reason why this constitution is preferably used is as follows. That is, in this constitution, since the surface formed with the pixel electrode 130 is not the same as the surface formed with the source signal line 114, it is possible to increase the surface area of the pixel electrode 130 while preventing an electrical short-circuit between the pixel electrode 130 and the source signal line 114. The pixel electrode 130 is formed on the insulation film 152, and the source signal line 114 is connected with the source electrode 124 formed under the insulation film 152.

The counter substrate 154 includes a transparent insulation substrate 156, and the counter electrode 132 provided on the transparent insulation substrate 156.

Figure 15:
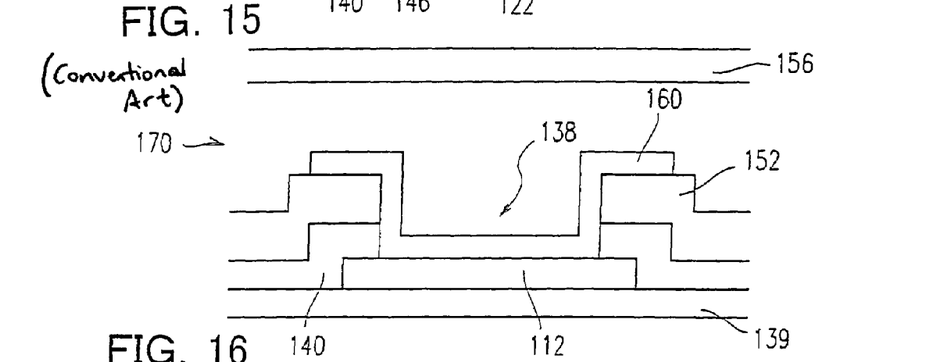
FIG. 15 is a cross-sectional view of the conventional liquid crystal display device taken along line Q-Q in FIG. 13.

FIG. 15 is a cross-sectional view of a conventional liquid crystal display device taken along line Q-Q in FIG. 13.

In FIG. 15, a cross-sectional structure of the signal input terminal section 138 in the gate driver 116 is shown in the terminal region 136 of the active matrix substrate 110.

The gate signal line 112 is formed on the transparent insulation substrate 139. The gate insulation film 140 is formed on the transparent insulation substrate 139 so as to cover both ends of the gate signal line 112. On the gate insulation film 140, the insulation film 152 is formed.

An antioxidation film 160 is formed so as to cover sides of the gate insulation film 140 and the insulation film 152 and a part of a surface of the insulation film 152. The antioxidation film 160 is for preventing the gate signal line 112 from oxidizing which increases the resistance. At this time, the material of the antioxidation film 160 is transparent ITO, and this ITO is the same material as the pixel electrode 130.

The above-mentioned conventional active matrix substrate 110 is manufactured by the following process.

The material for forming the gate signal line 112 and the gate electrode 122 on the transparent insulation substrate 139 is deposited by a sputtering method or the like. Then, the formed layer is mask-exposed, developed, and dry-etched to form the gate signal line 112 and the gate electrode 122, which have prescribed patterns.

Then, the material for forming the gate insulation film 140 is deposited on the transparent insulation substrate 139 by a CVD method so as to cover the gate signal line 112 and the gate electrode 122.

Then, the materials for forming the semiconductor layer 146 and the material for forming the n+ Si layer 148 are deposited by a CVD method on the material for forming the gate insulation film 140. The deposited materials for forming the semiconductor layer 146 and the n+ Si layer 148 are mask-exposed, developed, and dry-etched to form the semiconductor layer 146 and the n+ Si layer 148, which have prescribed patterns.

Then, the materials for forming the source signal line 114, the source electrode 124 and the drain electrode 126 (for example, Mo) are deposited on the gate insulation film 140 so as to cover the semiconductor layer 146 and the n+ Si layer 148. Then, the formed Mo is mask-exposed, developed, and dry-etched to form Mo having a prescribed pattern.

Then, Mo between the source electrode 124 and the drain electrode 126 is wet-etched to form a channel of the thin film transistor 120. Then, the source signal line 114, the source electrode 124 and the drain electrode 126 are formed.

Then, the material for forming the insulation film 152 is deposited on the gate insulation film 140 so as to cover the other parts of surfaces of the source electrode 124, the drain electrode 126 and the n+ Si layer 148.

Then, a part of the insulation film 152 on the drain electrode 126 is removed by a dry-etching using a mixed gas of $CF_4$ and $O_2$, to form contact hole 150 in the insulation film 152. A part of the insulation film 152 and a part of the gate insulation film 140 are continuously removed to expose a part of the surface of the gate signal line 112. The insulation film 152 is formed at an upper part of gate signal line 112 of the terminal region 136 (FIG. 12), and the gate insulation film 140 is formed on the gate signal line 112.

Then, ITO is deposited, and the deposited ITO is mask-exposed, developed, and etched to form the pixel electrode 130 and the antioxidation film 160, which have prescribed patterns. At this time, the pixel electrode 130 is formed on the insulation film 152 so as to electrically connect with the drain electrode 126 through the contact hole 150. On the other hand, the antioxidation film 160 is formed so as to cover a part of the surface of the gate signal line 112, sides of the gate insulation film 140 and the insulation film 152, and a part of the surface of the insulation film 152.

In the signal input terminal section 138 of the terminal region 136, a part of the surface of the gate signal line 112 is exposed by removing a part of the material for forming the insulation film 152 at the upper part of the gate signal line 112, and continuously removing a part of the material for forming the gate insulation film 140 on the gate signal line 112. In the display region 134, the contact hole 150 is formed in the insulation film 152, by removing a part of the insulation film 152 on the drain electrode 126. These processes are carried out by the same dry-etching.

However, since the same dry-etching continuously removes a part of the insulation film 152 in the display region 134 and the gate insulation film 140 in the terminal region 136, a part of the drain electrode 126 arranged under the insulation film 152 and a part of the gate insulation film 140 may be also removed in addition to a part of the insulation film 152 in the display region 134.

More particularly, an etching selection ratio between the insulation film 152 and the drain electrode 126 becomes insufficient, when a mixed gas of $CF_4$ and $O_2$ is used for the dry-etching, $SiN_X$ is used as the material of the insulation film 152, and Mo is used as the material of the drain electrode 126. Thereby, a part of the drain electrode 126 is removed.

Figure 16:
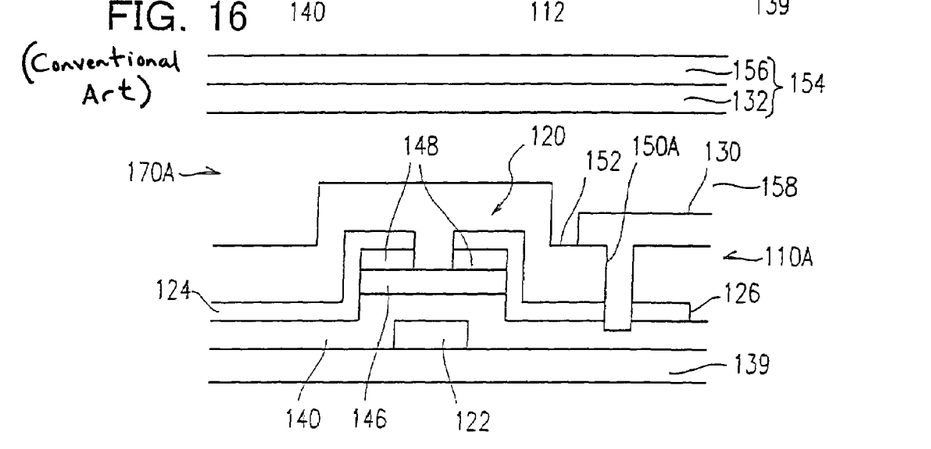
FIG. 16 is a cross-sectional view of the liquid crystal display device in FIG. 14, in which a contact hole penetrates not only an insulation film but also a drain electrode to reach in a gate insulation film.

FIG. 16 is a cross-sectional view of the liquid crystal display device, in which a contact hole 150A penetrates not only the insulation film 152 but also the drain electrode 126 to reach in the gate insulation film 140.

As shown in FIG. 16, in a liquid crystal display device 170A, when the contact hole 150A is formed, the pixel electrode 130 contacts with the drain electrode 126 at the cross-section of the drain electrode 126. The contact hole 150A penetrates not only the insulation film 152 but also the drain electrode 126 to reach in the gate insulation film 140. The drain electrode 126 has a remarkably small cross-section area as compared with a surface area of the contact hole 150A, and thus there is a problem that an electrical connection between the pixel electrode 130 and the drain electrode 126 is insufficient.

For solving the above problems, after the drain electrode 126 is formed, ITO is deposited on the drain electrode 126 to form a protective film. The insulation film 152 is formed on this protective film, and the contact hole 150 is formed in the insulation film 152 by mask-exposing, developing and dry-etching. Then, the formed protective film protects the drain electrode 126 with respect to the dry-etching, and thus preventing the drain electrode 126 from being etched.

However, if ITO is deposited on the drain electrode 126 to form the protective film, there are new problems increasing a cost and processing.

The present invention has arisen to mitigate and/or obviate these problems, and the primary objective of the present invention is to provide a substrate, a liquid crystal display device with the same, and a manufacturing method thereof without increasing the cost and processing. In the substrate, a first electrode and a second electrode are electrically connected stably through a contact hole. The second electrode is formed on an insulation film covering the first electrode, and the contact hole is formed in the insulation film.

DISCLOSURE OF THE INVENTION

A substrate according to the present invention comprises a first electrode and a second electrode. The second electrode is formed on an insulation film covering at least a part of the first electrode, and electrically connected with the first electrode through a contact hole formed on the insulation film. The first electrode has a laminated structure of a metal film and a protective film. An etching rate of the metal film is almost equal to that of the protective film with respect to a first etching for forming the metal film and the protective film. The etching rate of the protective film is almost zero with respect to a second etching for forming the contact hole. Thereby, the objective of the present invention is realized.

The protective film may be an amorphous conductive oxide.

The amorphous conductive oxide may be an oxide containing indium oxide and zinc oxide.

The metal film may contain molybdenum.

The protective film may be formed at a side of the contact hole with respect to the metal film.

The metal film may be formed at a side of the contact hole with respect to the protective film.

The substrate according to the present invention may also comprise a thin film transistor including the first electrode functioning as a drain electrode, a source electrode and a gate electrode. The second electrode may function as a pixel electrode controlled by the thin film transistor.

The substrate according to the present invention may also comprise a gate signal line and a gate insulation film. The gate signal line is branched from the gate electrode of the thin film transistor, and the gate insulation film covers at least parts of the gate electrode and the gate signal line. The drain electrode of the thin film transistor may be formed on the gate insulation film, and the protective film may protect the gate insulation film under the drain electrode from the second etching.

The liquid crystal display device according to the present invention comprises the substrate mentioned above, a counter substrate opposed to the substrate, and a liquid crystal inserted between the substrate and the counter substrate. Thereby, the objective of the present invention is realized.

The method for manufacturing the substrate according to the present invention includes the following processes, a process for forming a first electrode, a process for forming an insulation film covering at least a part of the first electrode, a process for forming a contact hole in the insulation film by removing a part of the insulation film, a process for forming a second electrode on the insulation film to electrically connect the first electrode and the second electrode through the contact hole. The process for forming the first electrode includes a process for laminating a metal film and a protective film, and a process for patterning the laminated metal film and protective film by a first etching. The etching rate of the metal film in the first etching is almost equal to an etching rate of the protective film. The process for forming the contact hole includes a process for forming the contact hole in the insulation film by a second etching. An etching rate of the protective film in the second etching is almost zero. Thereby, the objective of the present invention is realized.

The process for patterning may include a process for patterning the metal film and the protective film by wet-etching using a mixed solution of weak acid.

The manufacturing method according to the present invention is a method for manufacturing a substrate, in which the first electrode functions as a drain electrode of a thin film transistor and the second electrode functions as a pixel electrode controlled by the thin film transistor. The manufacturing method further includes processes for forming a gate signal line, forming a gate electrode of the thin film transistor, forming a gate insulation film covering at least a part of the gate signal line, forming a source signal line, forming a source electrode of the thin film transistor, and removing a part of the gate insulation film on the gate signal line. The gate electrode is branched from the gate signal line. The source electrode is branched from the source signal line. The second etching is a dry-etching. By the dry-etching, a part of the gate insulation film may be removed while forming the contact hole.

The protective film may be an amorphous conductive oxide.

The amorphous conductive oxide may be an oxide containing indium oxide and zinc oxide.

The metal film may contain molybdenum.

BEST MODE FOR CARRYING OUT THE INVENTION

Hereinafter, a liquid crystal display device, more particularly, a liquid crystal display device with an active matrix substrate is explained. The present invention is not limited to these liquid crystal display devices and liquid crystal display devices with the active matrix substrate. The present invention can be applied to an arbitrary constitution, in which a first electrode and a second electrode are electrically connected through a contact hole. The second electrode is formed on an insulation film covering the first electrode, and the contact hole is formed in the insulation film.

A liquid crystal display device in one example of the present invention includes an active matrix substrate, in which a drain electrode and a pixel electrode are electrically connected through a contact hole. The pixel electrode is formed on an insulation film covering the drain electrode, and the contact hole is formed in the insulation film.

Figure 1:
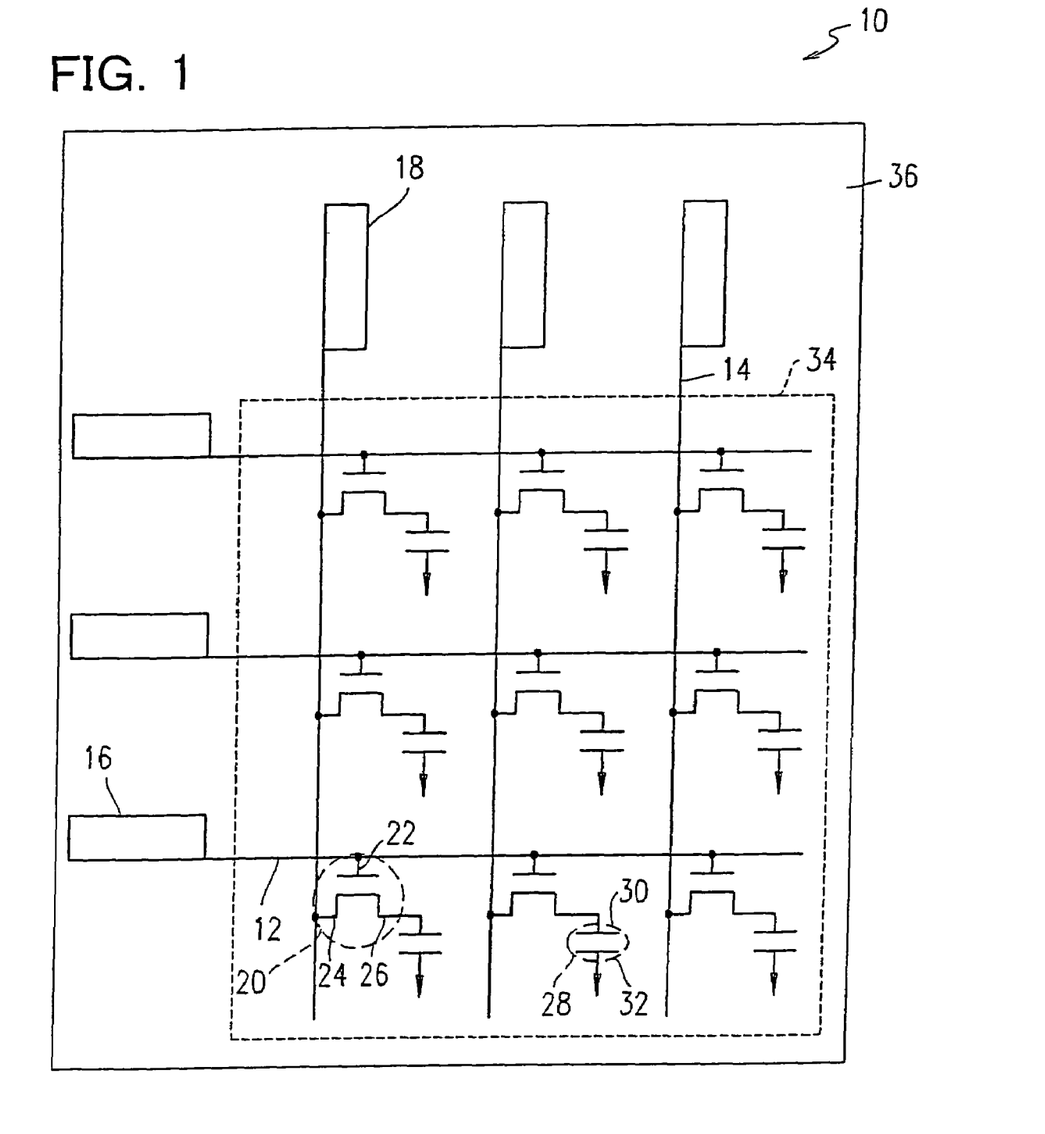
FIG. 1 is a schematic plan view of an active matrix substrate of a liquid crystal display device in one example of the present invention.

FIG. 1 is a schematic plan view of an active matrix substrate of a liquid crystal display device in one example of the present invention.

An active matrix substrate 10 includes a plurality of thin film transistors 20 (hereinafter, these are also referred to as "TFT"), a plurality of source signal lines 14, and a plurality of gate signal lines 12. The thin film transistors 20 are arranged in matrix states. The source signal lines 14 are provided in parallel having prescribed distances between each other along the thin film transistors 20 arranged along the column direction. The gate signal lines 12 are provided in parallel having prescribed distances between each other along the thin film transistors 20 arranged along the row direction.

To each of the plurality of source signal lines 14, corresponding source drivers 18 are connected respectively. Each source driver 18 applies a voltage to the corresponding source signal line 14. This voltage corresponds to video signals.

To each of the plurality of gate signal lines 12, corresponding gate driver 16 is connected respectively. Each gate driver 16 applies a voltage to the corresponding gate signal line 12. This voltage corresponds to scanning signals.

Each of the plurality of thin film transistors 20 includes a gate electrode 22, a source electrode 24 and a drain electrode 26. The gate electrode 22 is branched from the corresponding gate signal line 12, and the source electrode 24 is branched from the corresponding source signal lines 14.

Each of the plurality of drain electrodes 26 is connected with a corresponding pixel electrode 30. Each pixel electrode 30 is one terminal of a corresponding pixel capacitor 28. The other terminal of each pixel capacitor 28 is a counter electrode 32 provided on a counter substrate 54 (See FIGS. 3 and 4). The counter electrode 32 is shared by the plurality of pixel electrodes 30.

The active matrix substrate 10 includes a display region 34 and a terminal region 36. The display region 34 contributes to the display of a video. The terminal region 36 is arranged so as to surround a periphery of the display region 34. In the display region 34, the plurality of pixel electrodes 30 and the plurality of thin film transistors 20 are arranged. In the terminal region 36, the plurality of gate drivers 16 and the plurality of source drivers 18 are arranged.

Figure 3:
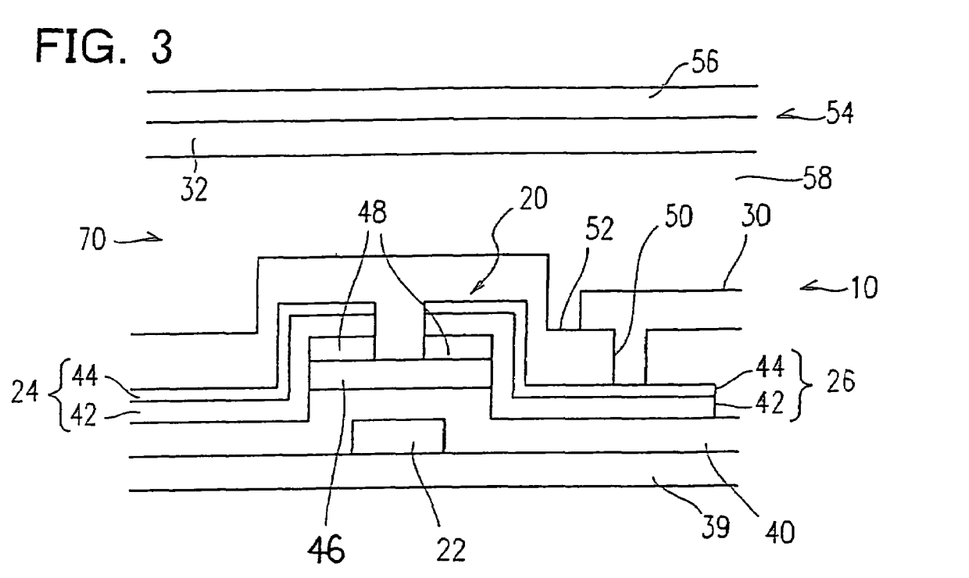
FIG. 3 is a cross-sectional view of the liquid crystal display device in one example of the present invention taken along line P-P in FIG. 2.

A liquid crystal display device 70 (See FIGS. 3 and 4) includes the active matrix substrate 10, the counter substrate 54 (See FIGS. 3 and 4), and a liquid crystal 58 (See FIG. 3). The counter substrate 54 is opposed to the active matrix substrate 10. The liquid crystal 58 is inserted between the active matrix substrate 10 and the counter substrate 54 (See FIGS. 3 and 4).

When each of the plurality of thin film transistors 20 is turned on or off with respect to signals applied from the gate driver 16, the voltage corresponding to video signals from the source driver 18 is applied to the corresponding pixel electrode 30. The orientation of the liquid crystal is controlled according to the voltages applied to the pixel electrode 30 and the counter electrode 32. Thereby, video is displayed on the liquid crystal display device 70 (See FIGS. 3 and 4).

Figure 2:
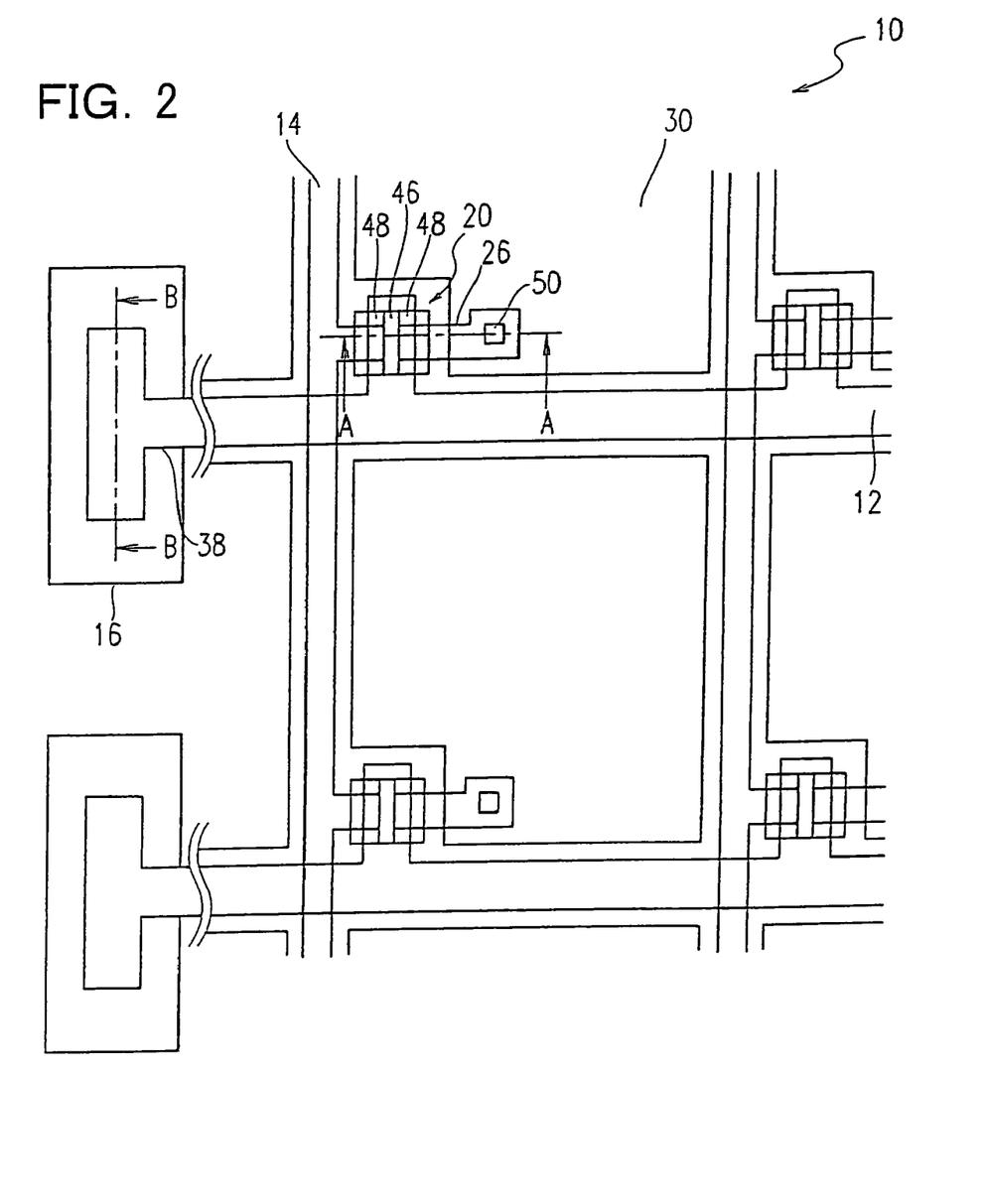
FIG. 2 is a plan view of the active matrix substrate in one example of the present invention.

FIG. 2 is a plan view of the active matrix substrate in one example of the present invention.

A gate driver 16 shown in FIG. 2 includes a signal input terminal section 38, in which scanning signals are inputted from the outside.

The pixel electrode 30 is connected with the drain electrode 26 through a contact hole 50.

FIG. 3 is a cross-sectional view of the liquid crystal display device in one example of the present invention taken along line A-A in FIG. 2.

The liquid crystal display device 70 shown in FIG. 3 includes the active matrix substrate 10, the counter substrate 54 and the liquid crystal 58. The liquid crystal is inserted between the active matrix substrate 10 and the counter substrate 54.

FIG. 3 shows a cross-sectional structure of the pixel electrode 30. The pixel electrode 30 is connected with the thin film transistor 20 and the drain electrode 26 of the thin film transistor 20, in the display region 34 of the active matrix substrate 10.

The active matrix structure includes a transparent insulation substrate 39. The gate electrode 22 is formed on the transparent insulation substrate 39. The gate electrode 22 includes a laminated structure of TaN, Ta and TaN (TaN/Ta/TaN).

A gate insulation film 40 is formed on the transparent insulation substrate 39 so as to cover the gate electrode 22.

A semiconductor layer 46 is formed on the gate electrode 22 through the gate insulation film 40. An n+ silicon (Si) layer 48 is formed on the semiconductor layer 46 so as to align with the semiconductor layer 46.

The source electrode 24 branched from the source signal line 14 is formed on a part of the gate insulation film 40 so as to cover a part of a surface of the n+ Si layer 48 and sides of the n+ Si layer 48 and the semiconductor layer 46.

The drain electrode 26 is formed on the other part of the gate insulation film 40 so as to cover the other part of the surface of the n+ Si layer 48 and the other sides of the n+ Si layer 48 and the semiconductor layer 46.

The source electrode 24 and the drain electrode 26 are arranged on the surface of the n+ Si layer 48 having prescribed distances between each other.

The drain electrode 26 includes a laminated structure of a metal film 42 and a protective film 44.

The thin film transistor 20 includes the gate electrode 22, the semiconductor layer 46, the n+ Si layer 48, the source electrode 24 and the drain electrode 26.

In the active matrix substrate 10, the source electrode 24 and the source signal line 14 also include the laminated structure of the metal film 42 and the protective film 44 like the drain electrode 26.

An insulation film 52 for protecting the thin film transistor 20 is formed on the gate insulation film 40 so as to cover the surfaces of the source electrode 24, the drain electrode 26 and the other parts of the n+ Si layer 48. A material of the insulation film 52 is, for example, $SiN_X$.

In the insulation film 52, the contact hole 50 is formed. The contact hole 50 penetrates the insulation film 52 to reach the drain electrode 26. The contact hole 50 is formed so as to connect with the protective film 44. That is, the protective film 44 is formed at a side of the contact hole 50 with respect to the metal film 42.

The pixel electrode 30 is formed on the insulation film 52 so as to connect with the drain electrode 26 through the contact hole 50. The material of the pixel electrode 30 is transparent ITO.

In the thin film transistor 20, the metal film 42 and the protective film 44 of the drain electrode 26 are formed by etching (the first etching). An etching rate of the metal film 42 is almost equal to that of the protective film 44 with respect to the etching for forming the metal film 42 and the protective film 44. Thereby, the metal film 42 and the protective film 44 which have almost same patterns are formed by simultaneously etching the metal film 42 and the protective film 44. In this case, the meaning that the etching rate of the metal film 42 is equal to that of the protective film 44 is that design errors between the metal film 42 and the protective film 44 which are simultaneously etched become within a desired range.

The etching rate of the protective film 44 is almost zero with respect to an etching for forming the contact hole 50 in the insulation film 52 (the second etching).

A material of the metal film 42 for satisfying such characteristics is, for example, Mo. A material of the protective film 44 is, for example, an amorphous conductive oxide. The amorphous conductive oxide is, for example, IZO. IZO is an oxide containing indium oxide and zinc oxide, and is In—Zn—O consisting principally of indium oxide and zinc oxide. In this case, IZO produced by Idemitsu Kosan Co. Ltd., which consists principally of $InO_2O_3$ and ZnO, is used as the amorphous conductive oxide.

The counter substrate 54 includes a transparent insulation substrate 56 and the counter electrode 32 provided on the transparent insulation substrate 56.

Figure 4:
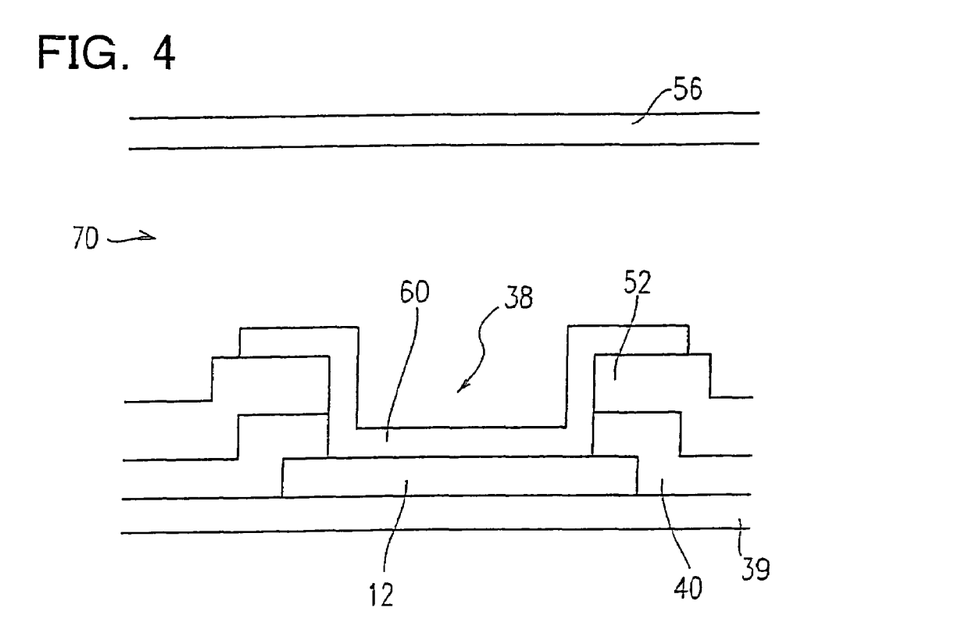
FIG. 4 is a cross-sectional view of the liquid crystal display device in one example of the present invention taken along line Q-Q in FIG. 2.

FIG. 4 is a cross-sectional view of the liquid crystal display device in one example of the present invention taken along line B-B in FIG. 2.

FIG. 4 shows a cross-sectional structure of the signal input terminal section 38 in the gate driver 16, in the terminal region 136 of the active matrix substrate 10.

The gate signal line 12 is formed on the transparent insulation substrate 39. The gate signal line 12 includes a laminated structure of TaN, Ta and TaN (TaN/Ta/TaN). At this time, the gate signal line 12 is formed with the same material as that of the gate electrode 22.

The gate insulation film 40 is formed on the transparent insulation substrate 39 so as to cover both ends of the gate signal line 12. The insulation film 52 is formed on the gate insulation film 40.

An antioxidation film 60 is formed so as to cover sides of the gate insulation film 40 and the insulation film 52 and a part of a surface of the insulation film 52. This antioxidation film 60 is for preventing the gate signal line 12 from being oxidized which increases the electric resistance. At this time, the material of the antioxidation film 60 is transparent ITO, and this is a same material as that of the pixel electrode 30.

FIGS. 5 to 10 are cross-sectional views for explaining a manufacturing method of the active matrix substrate in one example of the present invention.

FIG. 5(a), FIG. 6(a), FIG. 7(a), FIG. 8(a), FIG. 9(a) and FIG. 10(a) correspond a cross-sectional view taken along line A-A in FIG. 2, and show a process for forming the pixel electrode 30. This pixel electrode 30 is connected with the thin film transistor 20 and the drain electrode 26 of the thin film transistor 20 in the display region 34 (See FIG. 1).

FIG. 5(b), FIG. 6(b), FIG. 7(b), FIG. 8(b), FIG. 9(b) and FIG. 10(b) correspond a cross-sectional view taken along line B-B in FIG. 2, and show a process for forming the signal input terminal section 38 of the gate driver 16 in the terminal region 36 (See FIG. 1).

Figure 5A:
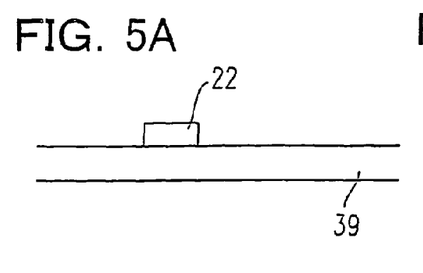
FIG. 5 is a cross-sectional view for explaining a manufacturing method of the active matrix substrate in one example of the present invention.
Figure 5B:
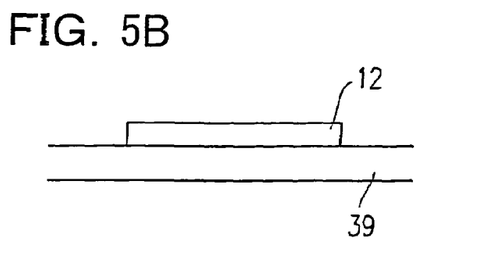

First, FIGS. 5(a) and (b) are referred. The material for forming the gate signal line 12 and the gate electrode 22 (for example, TaN/Ta/TaN) is deposited on the transparent insulation substrate 39 having a thickness of about 4000 Angstrom by a sputtering method or the like. Then, the deposited material is mask-exposed, developed and dry-etched to form the gate signal line 12 and the gate electrode 22, which have prescribed patterns.

Figure 6A:
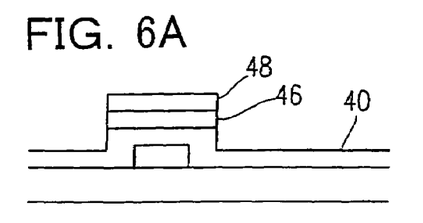
FIG. 6 is a cross-sectional view for explaining a manufacturing method of the active matrix substrate in one example of the present invention.
Figure 6B:
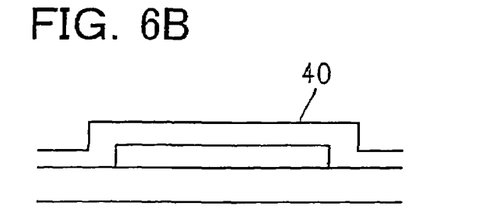

Then, FIGS. 6(a) and (b) are referred. The material for forming the gate insulation film 40 (for example, $Si_XN_Y$), the material for forming the semiconductor layer 46 and the material for forming the n+ Si layer 48 are continuously deposited so as to cover the gate signal line 12 and the gate electrode 6. These materials are deposited by a CVD method so as to have a total thickness of about 5000 Angstrom.

Then, the deposited materials are mask-exposed, developed, dry-etched and peeled to form the semiconductor layer 46 and the n+ Si layer 48, which have prescribed patterns.

As shown in FIGS. 6(a) and (b), in the display region 34 (See FIG. 1), the materials for forming the semi-conductor layer 46 and the n+ Si layer 48 are remained only within a region in the cross-section taken along the line A-A for forming the thin film transistor 20 (See FIG. 2). The materials for forming the semiconductor layer 46 and the n+ Si layer 48 are removed in the other region.

In the terminal region 36 (See FIG. 1), the materials for forming the semiconductor layer 46 and the n+ Si layer 48 are removed by etching.

Figure 7A:
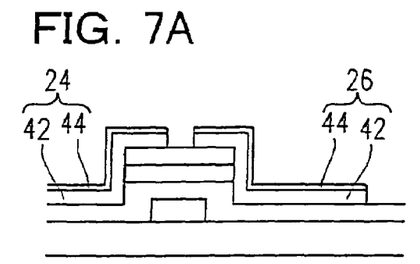
FIG. 7 is a cross-sectional view for explaining a manufacturing method of the active matrix substrate in one example of the present invention.
Figure 7B:
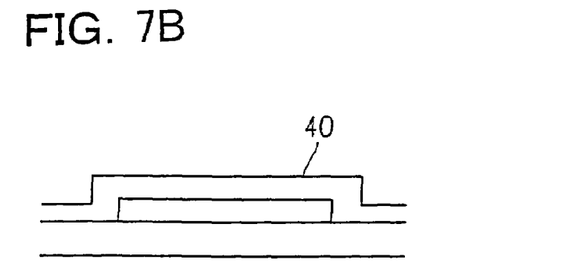

Then, FIGS. 7(a) and (b) are referred. On the gate insulation film 40, the material of the metal film 42 (for example, Mo) is deposited having a thickness of 1500 Angstrom, and continuously, the material of the protective film 44 (for example, IZO) is deposited having a thickness of 100 Angstrom by a sputtering method.

Then, a resist is patterned by mask-exposing and developing. Then, parts of the deposited materials of metal film 42 and the protective film 44 are removed by the wet-etching using a mixed solution of weak acids, for example, a mixed solution of 3% nitric acid, 73% phosphoric acid and 3% acetic acid.

The material of the metal film 42 (for example, Mo) and the material of the protective film 44 (for example, IZO) can be etched with the mixed solution of weak acids of nitric acid, phosphoric acid, acetic acid or the like, since the etching rate of the metal film 42 is almost equal to that of the protective film 44 with respect to the etching (wet-etching in this case) for forming the metal film 42 and the protective film 44. Therefore, the metal film 42 and the protective film 44 can be patterned by the same etching as one drain electrode 26.

In the signal input terminal section 38 of the terminal region 36 (See FIG. 1), both of the materials of the metal film 42 (for example, Mo) and the protective film 44 (for example, IZO) are removed by etching.

Then, a channel is formed between the source electrode 24 and the drain electrode 26 by dry-etching, and the source signal line 14, the source electrode 24 and the drain electrode 26 are formed. In this case, each of the source signal line 14, the source electrode 24 and the drain electrode 26 include a laminated structure of the metal film 42 and the protective film 44.

Figure 8A:
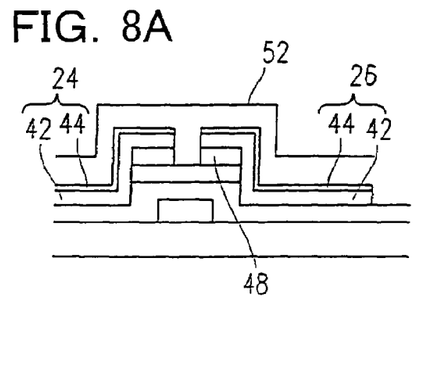
FIG. 8 is a cross-sectional view for explaining a manufacturing method of the active matrix substrate in one example of the present invention.
Figure 8B:
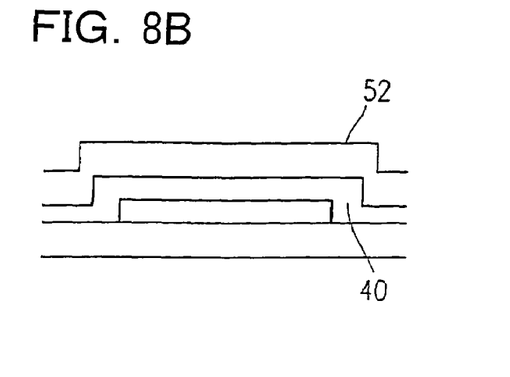

Then, FIGS. 8(a) and (b) are referred. The material of the insulation film 52 (for example, $Si_xN_y$) is deposited on the gate insulation film 40 so as to cover parts of surfaces of the source electrode 24, drain electrode 26 and the n+ Si layer 48. This material is deposited having a thickness of about 3500 Angstrom by a CVD method. Then, the material of the insulation film 52 is mask-exposed and developed to pattern the resist.

Figure 9A:
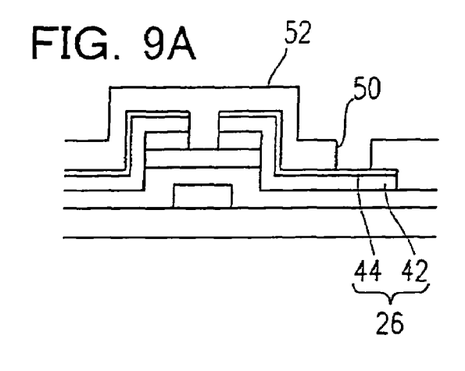
FIG. 9 is a cross-sectional view for explaining a manufacturing method of the active matrix substrate in one example of the present invention.
Figure 9B:
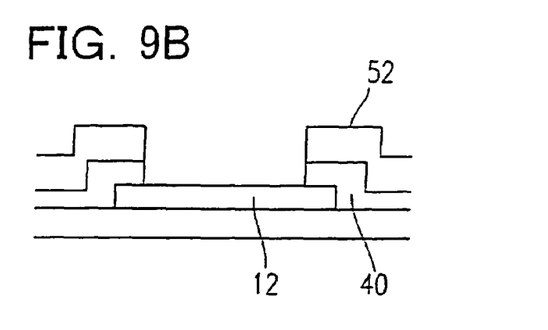

Then, FIGS. 9(a) and (b) are referred. In the display region 34 (See FIG. 1), the insulation film 52 on the protective film 44 of the drain electrode 26 is removed to form the contact hole 50. In the terminal region 36 (See FIG. 1), a part of the insulation film 52 formed at the upper part of the gate signal line 12 is removed, and continuously, a part of the gate insulation film 40 formed on the same gate signal line 12 is removed. These processes are carried out by the dry-etching using a mixed gas of $CF_4$ and $O_2$.

At this time, since the etching rate of the protective film 44 is almost zero with respect to the etching (the dry-etching in this case) for forming the contact hole 50 in the insulation film 52, a part of the drain electrode including the protective film 44 is not removed by this etching.

Figure 10A:
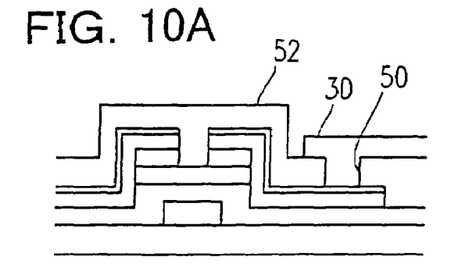
FIG. 10 is a cross-sectional view for explaining a manufacturing method of the active matrix substrate in one example of the present invention.
Figure 10B:
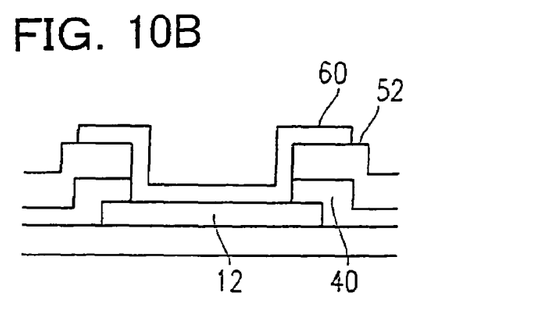

Then, FIGS. 10(a) and (b) are referred. ITO is deposited on the insulation film 52 by a sputtering method so as to cover the contact hole 50, the exposed gate signal line 12, and sides of the gate insulation film 40 and the insulation film 52.

Then, the deposited ITO is resist patterned by mask-exposing and developing, and is etched by ferric chloride to form the pixel electrode 30 and the antioxidation film 60.

The active matrix substrate 10 in one example of the present invention is manufactured as mentioned above.

FIGS. 9(a) and (b) are referred again. It is necessary to etch only the insulation film 52 in the display region 34. However, it is necessary to etch not only the insulation film 52 but also the gate insulation film 40 in the signal input terminal section 38 of the terminal region 36. Therefore, in the display region 34, the display region 34 is etched for a longer time than the necessary time for etching only the insulation film 52 of the display region 34.

However, according to the present invention, the protective film 44 does not contact with the metal film 42 but the insulation film 52. Therefore, when the display region 34 is etched for a longer time than the ordinary necessary time for etching, the drain electrode 26 is not damaged by dry-etching and the metal film 42 is protected without being etched.

When RIE (Reactive Ion Etching) is used as the dry-etching, the etching process is carried out as follows, reacting a solid material and gas, changing chemically the solid material to volatile gas and etching. When RIE (Reactive Ion Etching) is used for manufacturing the active matrix substrate 10, the protective film 44 containing indium cannot be etched with fluorine-based gas, since the compound of indium and fluorine has a low volatility. Therefore, since the pixel electrode 30 is connected with the surface of the drain electrode 26 through the contact hole 50, the pixel electrode 30 and the drain electrode 26 are electrically connected stably.

As mentioned above, according to one example of the present invention, the pixel electrode 30 is connected with the drain electrode 26 through the contact hole 50 formed in the insulation film 52, and the drain electrode 26 includes the laminated structure of the metal film 42 and the protective film 44. At this time, since the protective film 44 is formed at the side of the contact hole 50 with respect to the metal film 42, the drain electrode 26 is not damaged by dry-etching, and the contact hole 50 is not formed so as to extend to an inside of the drain electrode 26. Therefore, the pixel electrode 30 is connected with the surface of the drain electrode 26, and the pixel electrode 30 and the drain electrode 26 are electrically connected stably.

As the result, according to the present invention, the pixel electrode 30 and the drain electrode 26 can be electrically connected with containly without increasing the numbers of mask-exposing and etching, and the cost.

Figure 11:
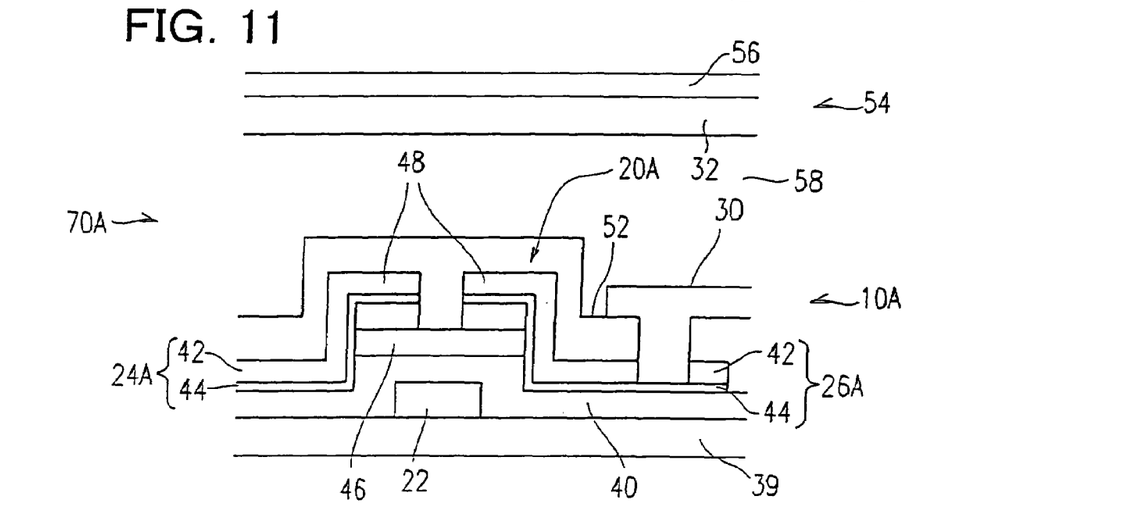
FIG. 11 is a cross-sectional view of a liquid crystal display device in another example of the present invention.

FIG. 11 is a cross-sectional view of a liquid crystal display device in another example of the present invention.

An active matrix substrate 10A of a liquid crystal display device 70A shown in FIG. 11 corresponds to a cross-section taken along the line A-A in FIG. 2. Same reference numbers as those of the active matrix substrate 10 are added if those are same constitution elements. Concrete explanations of these constitution elements are omitted.

The active matrix substrate 10A differs from the active matrix substrate 10, since it includes a drain electrode 26A and a source electrode 24A, in which the metal films 42 are formed at sides of the contact hole 50A with respect to the protective films 44.

When the active matrix substrate 10A is manufactured, it is necessary to etch not only the insulation film 52 but also the gate insulation film 40 in the terminal region 36 (See FIG. 1). Therefore, in the display region 34 (See FIG. 1), the display region 34 is etched for a longer time than the necessary time for etching only the insulation film 52 of the display region 34, and thus the metal film 42 formed so as to connect with the insulation film 52 is also etched.

However, in this example, since the protective film 44 is formed under the metal film 42, the metal film 42 is not damaged by dry-etching, and the contact hole 50A does not extend to the inside of protective film 44. Thereby, the pixel electrode 30 is connected with the protective film 44 of the drain electrode 26A of a thin film transistor 20A, and thus the pixel electrode 30 and the drain electrode 26A are electrically connected stably.

In the above explanation, although the IZO film consisting principally of the amorphous indium oxide and zinc oxide is explained as the example of the amorphous conductive oxide of the protective film 44, the amorphous conductive oxide is not limited to the IZO film. If an ITO film consisting principally of an amorphous indium oxide and tin oxide is used as the amorphous conductive oxide, the same effect as that obtained by the IZO film can be obtained.

An amorphous ITO can be formed by depositing ITO with $H_2O$ and $H_2$ or at a temperature lower than a crystallization temperature of ITO (with reference to J, Vac. Sci. Technol., A8(3), 1403(1990)).

INDUSTRIAL APPLICABILITY

According to the present invention, a first electrode and a second electrode are electrically connected stably through an insulation film on the first electrode without increasing the cost and processing.

The invention claimed is:

1. A substrate comprising
a first electrode, and a second electrode being formed on an insulation film so as to cover at least a part of said first electrode and electrically connected with said first electrode through a contact hole formed on said insulation film,
wherein said first electrode includes a laminated structure of a metal film and a protective film,
an etching rate of said metal film is almost equal to an etching rate of said protective film with respect to a first etching for forming said metal film and said protective film,
an etching rate of said protective film is almost zero with respect to a second etching for forming said contact hole,
said protective film is an amorphous conductive oxide, and
said amorphous conductive oxide is an oxide containing indium oxide and zinc oxide.

2. The substrate according to claim 1, wherein said metal film contains molybdenum.

3. The substrate according to claim 1, wherein said protective film is formed at a side of said contact hole with respect to said metal film.

4. The substrate according to claim 1, wherein said metal film is formed at a side of said contact hole with respect to said protective film.

5. The substrate according to claim 1, further comprising a thin film transistor including said first electrode functioning as a drain electrode, a source electrode and a gate electrode, wherein said second electrode functions as a pixel electrode controlled by said thin film transistor.

6. The substrate according to claim 5, further comprising a gate signal line being branched from said gate electrode of said thin film transistor and
a gate insulation film covering at least parts of said gate electrode,
wherein said drain electrode of said thin film transistor is formed on said gate insulation film, and
said protective film protects said gate insulation film under said drain electrode from said second etching.

7. A liquid crystal display device comprising, the substrate according to claim 1,
a counter substrate opposed to said substrate, and
a liquid crystal inserted between said substrate and said counter substrate.

8. A manufacturing method of a substrate comprising,
a process for forming a first electrode,
a process for forming an insulation film covering at least a part of said first electrode,
a process for forming a contact hole in said insulation film by removing a part of said insulation film, and
a process for forming a second electrode on said insulation film where said first electrode and said second electrode are electrically connected through said contact hole,
wherein
said process for forming the first electrode comprises,
a process for laminating a metal film and a protective film where said protective film is an amorphous conductive oxide and said amorphous conductive oxide is an oxide containing indium oxide and zinc oxide, and
a process for patterning both of said laminated metal film and protective film by a first etching where an etching rate of said metal film is almost equal to an etching rate of said protective film, and
said process for forming the contact hole comprises,
a process for forming said contact hole in said insulation film by a second etching where an etching rate of said protective film is almost zero.

9. The manufacturing method of the substrate according to claim 8,
wherein said process for patterning comprises a process for patterning said metal film and said protective film by wet-etching using a mixed solution of weak acid.

10. The manufacturing method of the substrate according to claim 8 where said first electrode functions as a drain electrode of a thin film transistor, and said second electrode functions as a pixel electrode controlled by said thin film transistor, the method further comprising,
a process for forming a gate signal line,
a process for forming a gate electrode of said thin film transistor where said gate electrode is branched from said gate signal line,
a process for forming a gate insulation film covering at least a part of said gate signal line,
a process for forming a source signal line,
a process for forming a source electrode of said thin film transistor where said source electrode is branched from said source signal line, and
a process for removing a part of said gate insulation film on said gate signal line,
wherein
said second etching is a dry-etching, and a part of said gate insulation film is removed while forming said contact hole by said dry-etching.

11. The substrate according to claim 8, wherein said metal film contain molybdenum.

* * * * *